United States Patent [19]

Harris

[11] Patent Number: 4,479,094
[45] Date of Patent: Oct. 23, 1984

[54] DIFFERENTIAL AMPLIFIER

[75] Inventor: David J. Harris, San Jose, Calif.

[73] Assignee: Raytheon Company, Lexington, Mass.

[21] Appl. No.: 382,278

[22] Filed: May 26, 1982

[51] Int. Cl.³ .............................................. H03F 3/45
[52] U.S. Cl. .................................. 330/261; 307/355; 307/565; 330/296; 330/311
[58] Field of Search ....................... 330/261, 311, 296; 307/354, 355, 364, 565, 566

[56] References Cited

U.S. PATENT DOCUMENTS 3,461,397  8/1969  Cunningham ...................... 330/261

OTHER PUBLICATIONS

"A Fast, Latching Comparator for 12 Bit A/D Applications", by George Erdi, IEEE Journal of Solid-State Circuits, vol. SC-15, No. 6, Dec. 1980, pp. 949–954.
"A 100 μV 120ns Strobed Comparator", by Robert W. Webb and Rodrigo T. Barroso, 1979 IEEE International Solid-State Circuits Conference, pp. 130–131.
"Advanced Micro Devices—Linear and Interface Data Book", 1979, pp. 2-19 to 2-26.
"A New High-Speed Comparator, The Am685", by Jim Giles and Alan Seales, pp. 2-39 to 2-47.

*Primary Examiner*—James B. Mullins
*Attorney, Agent, or Firm*—Richard M. Sharkansky; Joseph D. Pannone

[57] ABSTRACT

A differential amplifier having a pair of common base transistors with emitter electrodes adapted for coupling to an input signal and collector electrodes coupled to a voltage source through a pair of resistors. A pair of clamping diodes is connected, in opposing polarity, across the collector electrodes to limit the differential voltages produced at such collector electrodes. A bias circuit is provided between the voltage source and the common base electrodes of the transistors to provide a bias voltage at the common base electrodes which is as close to the voltage of the voltage supply without biasing either one of such pair of transistors into saturation. The bias circuit includes a first resistor connected between the voltage source and the common base electrodes and, in parallel with such first resistor, second resistor and serially connected diode. The emitter electrodes of the pair of transistors is connected to a current source matched to a current source coupled to the bias circuit so that the voltage drop produced across the bias circuit is equal to the voltage drop produced between the voltage source and the collector electrodes of the pair of transistors. With such arrangement, such differential amplifiers may be used in a cascade connected multi-gain stage of a comparator circuit with level shifting provided therein with Zener connected transistors following the cascaded gain stages thereby reducing the effect of process created variations in the Zener connected transistors and the pair of clamping diodes on such comparator circuit.

14 Claims, 2 Drawing Figures

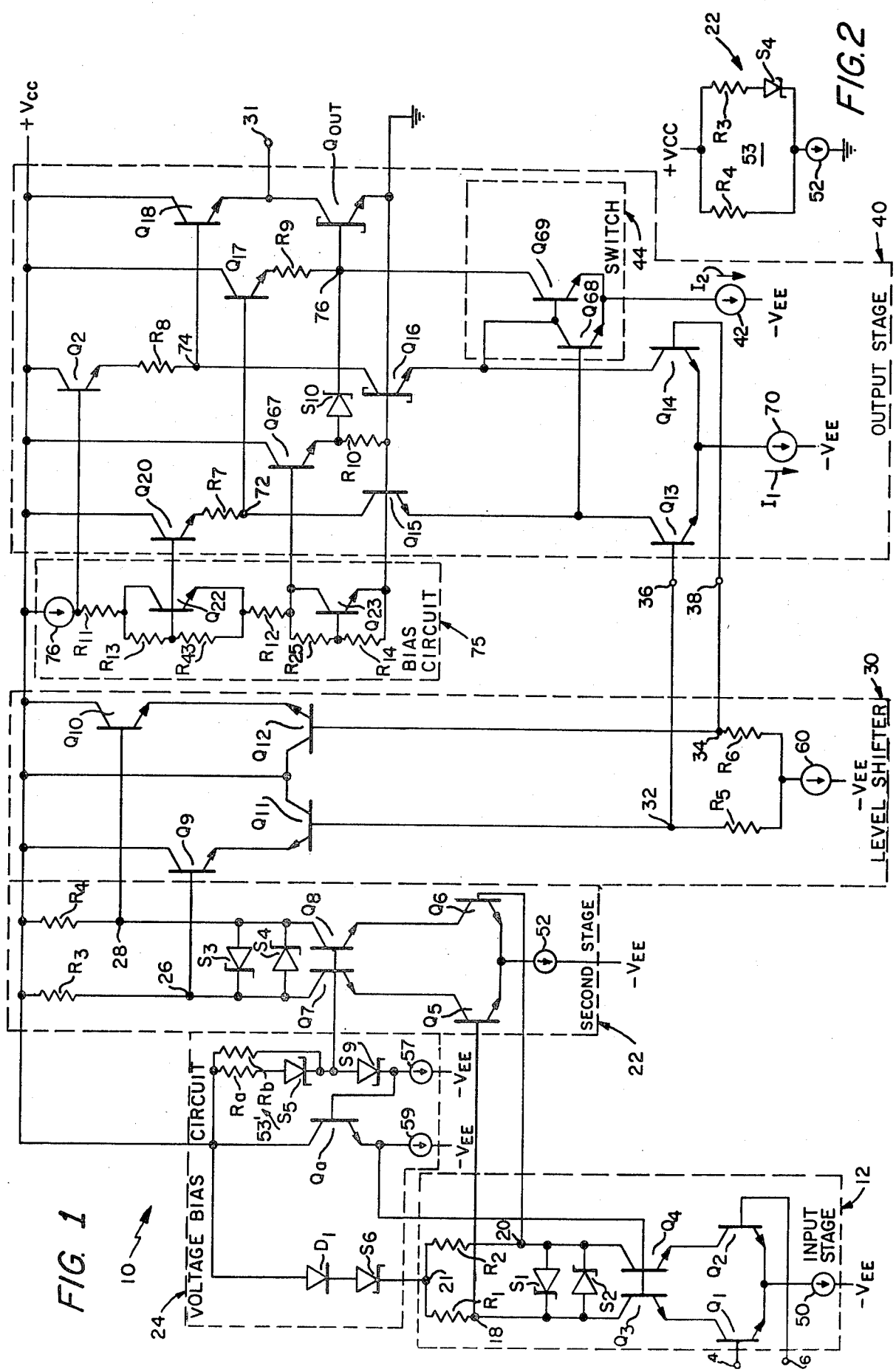

DIFFERENTIAL AMPLIFIER

BACKGROUND OF THE INVENTION

This invention relates generally to differential amplifier circuits and more particularly to comparators which include such differential amplifier circuits.

As is known in the art, many comparator circuits include a differential amplifier circuit as an input stage thereof. In order to provide a relatively wide bandwidth amplifier circuit using standard integrated circuit processing techniques, such differential amplifier circuit usually includes a pair of n-p-n transistors arranged with their base electrodes adapted for coupling to an input signal and with their emitter electrodes connected to a common current source. In order to provide a relatively high gain to the input signal, it is frequently desired to provide a multi-stage comparator. When n-p-n transistors are used in such multi-stage comparator circuit, however, the DC level of the input signal is shifted towards the positive collector voltage supply, typically referred to as $+V_{cc}$. Consequently, such multi-stage comparator circuit typically includes a level shifter following the amplifier stage to shift the DC level of the amplified signal negatively. Typically, the level shifter circuit includes Zener diodes. One technique used to reduce the effect of poor processing caused matching of the Zener diode is to provide buried Zener diodes after the first gain stage as described in an article entitled "A Fast, Latching Comparator for 12 Bit A/D Applications", by G. Erdi, IEEE Journal of Solid-State Circuits, Vol. SC-15, No. 6, December 1980. The use of buried Zener diodes, however, requires a deviation from standard integrated circuit processing techniques.

SUMMARY OF THE INVENTION

In accordance with the present invention, a comparator circuit is provided having a plurality of cascade connected gain stages coupled to an input signal, a level shifter circuit fed by the plurality of gain stages, and an output circuit fed by the level shifter circuit. The level shifter circuit and the plurality of gain stages include n-p-n transistors, the n-p-n transistors of the level shifter circuit being connected as Zener diodes. With such arrangement, the effect of processing variations in the voltages produced by the Zener diode connected transistors, reflected at the input of the cascade connected gain stages, is reduced by the total gain of the plurality of cascade connected stages.

Each one of the gain stages includes a pair of transistors having base electrodes thereof connected together at a first junction, a first one of the emitter and collectors of each one of the pair of transistors being coupled to an input signal source and a current source and a second one of the emitter and collector electrodes of each one of the pair of transistors being coupled to a common voltage source through a corresponding one of a pair of resistors. A pair of diodes is connected, in opposite polarity, between the second ones of the electrodes of the pair of transistors. A bias circuit is provided between the common voltage source and the first junction to prevent saturation of the pair of transistors. More particularly, the biasing circuit includes a first resistor and a second resistor and a device having a p-n junction, such second resistor and the p-n junction of the device being serially connected together with the first resistor connected in parallel with the serially connected second resistor and p-n junction. With such biasing circuit, the first and second resistors are matched to the pair of resistors in the gain stage and the p-n junction device is matched to each one of the pair of diodes in such gain stage. With such arrangement, the voltage produced by the bias circuit at the common base electrodes of the pair of transistors is prevented from becoming more positive than the voltage at the collector electrode of such a conducting one of the pair of transistors thereby preventing such transistor from saturating.

BRIEF DESCRIPTION OF THE DRAWINGS

The foregoing features of the invention as well as the invention itself may be more fully understood from the following description read together with the accompanying drawings, in which:

FIG. 1 is a schematic diagram of a comparator circuit according to the invention; and, FIG. 2 is an equivalent circuit diagram of an amplifier gain stage included in the comparator circuit of FIG. 1.

DESCRIPTION OF THE PREFERRED EMBODIMENT

Referring now to FIG. 1, a multi-stage comparator circuit 10 is shown to include an input stage 12 having a pair of input terminals 14, 16 and a pair of output terminals 18, 20 as shown. The output of the input stage 12 is coupled to the input of a second stage 22, as shown. Bias voltages are provided to the input and second stages 12, 22 by a voltage bias circuit 24, as shown. The output of the second stage appears at a pair of output terminals 26, 28 and such output is fed to a level shifter 30, as shown. Thus, input stage 12 and second stage 22 here provide a predetermined gain to the signal fed to the input terminals 14, 16. Here input stage 12 provides a gain of 20 and second stage 22 provides a gain of 25 to thereby amplify the input signal by a factor of five hundred; such amplified signal appearing at the output terminals 26, 28. It is noted, however, that the DC voltage level of the amplified signal is shifted towards the +Vcc, (here 5 volt) supply and hence level shifter 30 is provided to shift, in a negative sense, the DC level of the amplified signal appearing across output terminals 26, 28. The level shifted signal is produced at output terminals 32, 34 of level shifter 30 and is fed to a pair of input terminals 36, 38 of output stage 40, as shown. Output stage 40 includes an output transistor $Q_{OUT}$ (here a Schottky transistor) which is driven to either a conducting condition or a nonconducting condition selectively in accordance with the signal fed to the pair of input terminals 36, 38. More particularly, if the voltage at input terminal 14 is more positive than the voltage at input terminal 16, output transistor $Q_{OUT}$ is driven to a nonconducting condition and a "high" or logical 1 signal is produced at the output 31 of the comparator 10 whereas, if the voltage at input terminal 16 is more positive than the voltage at input terminal 14, transistor $Q_{OUT}$ is driven to a conducting condition and a "low" or logical 0 signal is produced at the output 31 of comparator 10. Output stage 40 also includes a current source 42 and a switch 44 coupled to the current source 42, as shown. In response to the signals fed to the input terminals 36, 38, switch 44 electrically couples the current source 42 to the base electrode of output transistor $Q_{OUT}$ when such output transistor is being driven from the conducting condition to the nonconducting condition to thereby provide an active current sink for removing base charge from the output transistor as it is being turned "off".

Referring now in more detail to the input stage 12, it is first noted that such stage 12 includes a pair of common emitter transistors $Q_1$, $Q_2$ having base electrodes connected to input terminals 14, 16, respectively, as shown, and emitter electrodes connected to a $-V_{EE}$ supply (here $-5$ to $-15$ volts) through a current source 50, as shown, here a 2.25 milliamp current source. The collector electrodes of transistors $Q_1$, $Q_2$ are connected to the emitter electrodes of a cascode connected (i.e. common base) pair of transistors $Q_3$, $Q_4$, as shown. Schottky diodes $S_1$, $S_2$ are connected across the collectors of transistors $Q_3$, $Q_4$, in opposing polarity as shown, to limit the voltage swing across the collectors of transistors $Q_3$, $Q_4$. The base electrodes of transistors $Q_3$, $Q_4$ are connected to the $+V_{cc}$ supply through voltage bias circuit 24, as shown. The collector electrodes of transistors $Q_3$, $Q_4$ are connected to a pair of resistors $R_1$, $R_2$ at output terminals 18, 20, respectively, as shown. The resistors $R_1$, $R_2$ are connected together at terminal 21, such terminal 21 being connected to the $+V_{cc}$ supply through the voltage bias circuit 24, as shown.

The amplified signal at output terminals 18, 20 is fed to the second stage 22. Second stage 22 includes a pair of common emitter transistors $Q_5$, $Q_6$ having base electrodes connected to output terminals 18, 20, respectively, as shown, and emitter electrodes connected to the $-V_{EE}$ supply through a current source 52, here a 2.0 milliamp current source. A pair of cascode connected, common base transistors $Q_7$, $Q_8$ is connected to the collector electrodes of transistors $Q_5$, $Q_6$, as shown, the base electrodes being connected to the bias circuit 24, as shown. Schottky diodes, $S_3$, $S_4$ are connected, in opposite polarity, across the collector electrodes of transistors $Q_7$, $Q_8$, as shown, to limit the voltage swing across such collectors. The collector electrodes of transistors $Q_7$, $Q_8$ are connected to output terminals 26, 28, respectively, as shown, to $+V_{cc}$ through resistors $R_3$, $R_4$, respectively, as shown.

The bias circuit 24 is disposed to provide a voltage at the base electrodes of transistors $Q_7$, $Q_8$ which is as close to $+V_{cc}$ as possible without placing transistors $Q_7$, $Q_8$ in saturation. The voltage is established at the bases of transistors $Q_7$, $Q_8$ by serially connected resistor $R_a$ and Schottky diode $S_5$ and a shunt connected resistor $R_b$. The base electrodes of transistors $Q_7$, $Q_8$ are connected to the anode of Schottky diode $S_9$, the cathode of which is connected to $-V_{EE}$ through a current source 57 and to the base of transistor $Q_a$, as shown. The collector of $Q_a$ is connected to the $+V_{cc}$ and the emitter is connected to the base electrodes of transistors $Q_3$, $Q_4$ and to $-V_{EE}$ through a current source 59, as shown. In order to prevent saturation of transistors $Q_7$, $Q_8$, a voltage is produced at the base electrodes of such transistors such that the collector electrode of either one of such transistors $Q_8$, $Q_9$ will not be more than $V_{BE}/2$ volts (where $V_{BE}$ is the base to emitter junction voltage drop, here 0.7 v) below (i.e. more negative than) the voltage at the base electrode of such transistors. That is, to prevent saturation, the base-collector junction of transistors $Q_8$, $Q_9$ are prevented from becoming forward biased.

In order to better understand the biasing circuit 24, reference is first made to FIG. 2 which shows an equivalent circuit for the second stage 22 when one of the transistors $Q_7$, $Q_8$, here transistor $Q_8$ (and hence transistor $Q_6$) is conducting substantially all of the current provided by current source 52. As noted in FIG. 2, the current source 52 is coupled to the voltage source $+V_{cc}$ through a parallel network 53 having in one path thereof the resistor $R_4$ and in the other path the resistor $R_3$ and a serially connected Schottky diode $S_4$. Thus, when transistor $Q_8$ conducts the voltage at the anode of diode $S_4$ (and hence at the collector electrode of transistor $Q_8$) is $(V_{cc}-V_P)$, where $V_P=(I_{52}R_3-V_{S4})R_4/(R_3+R_4)$ where $V_{S4}$ is the voltage drop across the Schottky diode $S_4$ and $I_{52}$ is the current supplied by current source 52. Referring again to FIG. 1, a parallel circuit 53' is connected between $+V_{cc}$ and the base electrodes of transistors $Q_7$, $Q_8$. Parallel circuit 53' includes the resistor $R_b$, connected between $+V_{cc}$ and the base electrodes of transistors $Q_7$, $Q_8$, and, in parallel therewith, the resistor $R_a$ and the serially coupled Schottky diode $S_5$. It is noted that parallel circuit 53' is connected to $-V_{EE}$ through Schottky diode $S_9$ and current source 57. Here the current provided by current source 57 is $I_{57}$. Further, current sources 52, 57 are formed on the same semiconductor body and are thermally, and process matched, in a conventional manner. Still further, here $I_{57}$ is one-fourth $I_{52}$, that is, here $I_{57}$ is 0.5 milliamp. Here the resistances of $R_a$ and $R_b$ are each equal to four times the resistances of resistors $R_3$, $R_4$ so that $R_a=R_b=4R_3=4R_4$ and the area of Schottky diode $S_5$ is one-fourth the area of each of the diodes $S_3$, $S_4$ so that $V_{S3}=V_{S4}=V_{S5}$. Further, all resistors $R_a$, $R_b$, $R_3$ and $R_4$ as well as diodes $S_3$, $S_4$ and $S_5$ are all formed on the same chip and all thus thermally matched. It follows then that the bias voltage at the anode of Schottky diode $S_5$ (and hence at the base of transistors $Q_7$, $Q_8$) is $(V_{cc}-V_{P'})$, where $V_{P'}=(I_{57}R_a-V_{S5})R_b/(R_a+R_b)$ where $V_{S5}$ is the voltage drop across the Schottky diode $S_5$. Therefore, since: $I_{57}=(I_{52}/4)$; $R_a=R_b=4R_3=4R_4$; and $V_{S4}=V_{S5}$ it follows that $V_{P'}=V_P$. Therefore, since the parallel circuit 53' is configured to produce a bias voltage at the base electrodes of transistors $Q_7$, $Q_8$ substantially equal to the voltage at the anode of the conducting one of the Schottky diodes $S_3$, $S_4$ (i.e. at the collector electrode of the conducting one of the transistors $Q_7$, $Q_8$) transistors $Q_7$, $Q_8$ are prevented from becoming saturated. Further, variations in the characteristics of resistors $R_3$, $R_4$ and diodes $S_3$, $S_4$ as a result of process variations are matched to those in resistors $R_a$, $R_b$ and diode $S_5$ so that the voltage variations produced between $+V_{cc}$ and the collectors of transistors $Q_7$, $Q_8$ as a result in changes in the characteristics of $R_3$, $R_4$ and $S_3$, $S_4$ are compensated for by corresponding changes in the characteristics of resistors $R_a$, $R_b$ and diode $S_5$ with the result that the bias voltage at the base of transistors $Q_7$, $Q_8$ remains fixed relative to the voltage of the collector electrode of the conducting one of the transistors $Q_7$, $Q_8$ despite variations in the characteristics of $R_3$, $R_4$, $S_3$ and $S_4$. To put it another way, the parallel circuit 53' (FIG. 1) simulates the equivalent parallel circuit 53 (FIG. 2) of the pair of transistors $Q_7$, $Q_8$ when either one of such transistors is fully conducting so that the bias voltage at the base electrodes of such transistors $Q_7$, $Q_8$ is substantially equal to the bias voltage at the collector electrode of the conducting one of the transistors $Q_7$, $Q_8$ regardless of process created variations in the formation of resistors $R_3$, $R_4$ and diodes $S_3$, $S_4$. In this way, the collector-base junction of such transistors are prevented from becoming forward biased and transistors $Q_7$, $Q_8$ are thus prevented from saturating despite these process created variations. In view of the foregoing, the bias voltage at the base electrodes of transistors $Q_7$, $Q_8$ is made as close to $+V_{cc}$ as possible without allowing saturation of transistors $Q_7$, $Q_8$ thereby maximizing the common mode (or dynamic operating range) of the stage since an accurate bias circuit $53'$ is provided between $+V_{cc}$ and the base electrodes of transistors $Q_7$, $Q_8$.

Having provided circuit $53'$ to prevent saturation of transistors $Q_7$, $Q_8$, diodes $D_1$ and $S_6$ are provided to prevent saturation of transistors $Q_5$, $Q_6$. Thus, since the emitter electrode of the conducting one of the transistors $Q_7$, $Q_8$ (and hence the collector electrode of the conducting one of the transistors $Q_5$, $Q_6$) is one $V_{BE}$ lower than its base electrode, it is necessary to limit the bias voltage on the base electrode of transistors $Q_5$, $Q_6$ to $(V_{cc} - V_{P'} - V_{BE})$ to prevent their saturation. Considering the case when one of the transistors $Q_3$, $Q_4$ conducts, say, for example the case when transistor $Q_4$ conducts. Thus, current passes through diode $D_1$, diode $S_6$, resistor $R_2$ and also through resistor $R_1$ and the serially connected diode $S_2$. The resistance of resistor $R_1$ is selected so that the voltage drop across resistor $R_1$ is here equal to the voltage drop across resistor $R_a$ of circuit $53'$ and the voltage drop across $S_6$ is the same as the drop across diode $S_5$. Further, to provide an additional $V_{BE}$ drop between the collector electrode of transistor $Q_5$ and its base electrode to match the drop across the base and emitter electrodes of transistor $Q_7$ (or transistor $Q_8$), the diode $D_1$ is provided. That is, the drop across the base-emitter junction of transistor $Q_7$ is tracked by diode $D_1$ with the result that the voltage at the base electrode of transistor $Q_5$ is one $V_{BE}$ lower than the bias voltage at the base electrode of transistor $Q_7$, and hence the bias voltage at the base electrode of transistor $Q_5$ (or transistor $Q_6$) will be equal to $(V_{cc} - V_{P'} - V_{BE})$, i.e. equal to the voltage at the collector of transistor $Q_5$, thereby preventing saturation of transistor $Q_5$. In like manner, transistor $Q_6$ is prevented from saturating by selecting the resistor $R_2$ equal to resistor $R_1$ and the drop across diode $S_1$ equal to the drop across diode $S_2$.

To prevent saturation of transistors $Q_3$, $Q_4$, diode $S_9$ and the p-n junction of transistor $Q_a$ are provided. Thus, the total voltage drop across $S_9$ and the p-n junction of transistor $Q_a$ is made equal to the total voltage across diode $D_1$ and the Schottky diode $S_6$ with the result that the bias voltage at the base electrodes of transistors $Q_3$, $Q_4$ is equal to, or slightly more negative than, the bias voltage at the collector of the conducting one of the transistors $Q_3$, $Q_4$ thereby preventing saturation of such transistors. Here, the voltage terminal 21 is 1.2 volts lower than $+V_{cc}$. The voltage between the base electrodes of $Q_7$, $Q_8$ and the base electrodes of transistors $Q_3$, $Q_4$ is here 1.2 volts. The voltage at the base of $Q_7$, $Q_8$ is $(V_{cc} - 0.9$ volts$)$.

The level shifter 30 shifts the DC level of the signal produced at terminals 26, 28 negatively by here 7.0 volts. Thus, level shifter 30 includes a pair of transistors $Q_9$, $Q_{10}$ having base electrodes connected to terminals 26, 28, respectively, as shown and collector electrodes connected to $+V_{cc}$, as shown. The emitter electrodes of transistors $Q_9$, $Q_{10}$ are connected to the emitter electrodes of transistors $Q_{11}$, $Q_{12}$, respectively, as shown. Transistors $Q_{11}$, $Q_{12}$ have collectors connected together and to $+V_{cc}$, as shown. The base electrodes of transistors $Q_{11}$, $Q_{12}$ are connected to output terminals 32, 34, respectively, as shown. Terminals 32, 34 are connected to $-V_{EE}$ through a current source 60 and through a pair of resistors $R_5$, $R_6$, respectively, as shown (here 1.5K ohm resistors). Thus, transistors $Q_{11}$, $Q_{12}$ are connected as Zener diodes and hence provide a fixed predetermined voltage drop, here 6.3 volts, across the emitter-base junctions thereof, thus, considering a 0.7 volt drop across the base-emitter junction of transistors $Q_9$, $Q_{10}$, the DC level of the signal at output terminals 26, 28 is shifted negatively by a fixed 7.0 volts. It is noted that because of the finite resistance provided by the "Zener" transistors $Q_{11}$, $Q_{12}$, a voltage divider effect is produced with such resistance and resistors $R_5$ and $R_6$ with the result that here a "gain" of 0.85 is provided by the level shifter 30.

The output stage 40 includes a pair of common emitter transistors $Q_{13}$, $Q_{14}$ having their base electrodes connected to input terminals 36, 38, respectively, as shown. The emitter electrodes of such transistors $Q_{13}$, $Q_{14}$ are connected to $-V_{EE}$ through a current source 70, here a 3 milliamp current source. The collector electrodes of transistors $Q_{13}$, $Q_{14}$ are connected to a pair of cascode, grounded base connected transistors $Q_{15}$, $Q_{16}$, as shown and to switch 44, as shown. (It is noted that transistor $Q_{16}$ is here a Schottky transistor.) The collector electrodes of transistors $Q_{15}$, $Q_{16}$ are connected to a pair of resistors $R_7$, $R_8$ at terminals 72, 74, respectively, as shown. Resistors $R_7$, $R_8$ are connected to $+V_{cc}$ through the emitter-collector electrodes of transistors $Q_{20}$, $Q_{21}$, respectively, as shown. The base electrodes of transistors $Q_{20}$, $Q_{21}$ are connected to a suitable output stage voltage bias circuit 75 which includes a current source 76, resistors $R_{11}$, $R_{12}$, $R_{13}$, $R_{14}$, $R_{25}$, $R_{43}$ and transistors $Q_{22}$, $Q_{23}$ arranged as shown to provide a fixed voltage, here 2.0 volts, at the emitter electrode of transistor $Q_{20}$ and a fixed voltage, here 3.4 volts, at the emitter electrode of transistor $Q_{21}$. Terminal 72 is connected to the base electrode of emitter follower transistor $Q_{17}$ which has its collector electrode connected to $+V_{cc}$ and its emitter electrode connected to the base electrode of output transistor $Q_{OUT}$ at terminal 76, as shown, through resistor $R_9$, here 300 ohms. Terminal 74 is connected to the base electrode of pull-up transistor $Q_{18}$, such transistor $Q_{18}$ having its collector connected to $+V_{cc}$ and its emitter connected to the collector of transistor $Q_{OUT}$ at output terminal 31, as shown. It is also noted that the base electrode of transistor $Q_{OUT}$ is connected to an emitter of an emitter follower transistor $Q_{67}$ through a Schottky diode $S_{10}$, the emitter of transistor $Q_{67}$ also being connected to ground through resistor $R_{10}$, as shown. The base electrode of transistor $Q_{67}$ is connected to the bias circuit 75 and the collector is connected to $+V_{cc}$. Here bias circuit 75 produces a fixed voltage, here 0.7 volts at the emitter of transistor $Q_{67}$.

Switch 44 includes a pair of common emitter transistors $Q_{68}$, $Q_{69}$; the base electrode of transistor $Q_{68}$ being connected to the collector electrode of transistor $Q_{13}$, and the base electrode of transistor $Q_{69}$ is connected to both the collector electrode of transistor $Q_{68}$ and the collector electrode of transistor $Q_{14}$. The collector electrode of transistor $Q_{69}$ is connected to the base electrode of transistor $Q_{OUT}$ at terminal 76 and the emitter electrodes of transistors $Q_{68}$, $Q_{69}$ are connected to $-V_{EE}$ through the current source 42, as shown.

Considering the small signal gain of the output stage 40, let it be assumed that both transistors $Q_{13}$, $Q_{14}$ are in condition with one half of the current $I_1$, produced by current source 70 flowing through the collector electrodes of such transistors $Q_{13}$, $Q_{14}$, i.e. each collector passing a current $I_1/2$. Thus, while the gain provided to the voltage at the input terminals 36, 38 by the common emitter transistors $Q_{13}$, $Q_{14}$ is approximately one, the gain provided by the cascoded transistor $Q_{15}$ between input terminal 36 and terminal 72 may be represented as $-(g_{m15} R_7)/2$ where $g_{m15}$ is the transconductance of transistors $Q_{15}$ and $R_7$ is the resistance of resistor $R_7$. Likewise, the gain provided by cascoded transistor $Q_{16}$ between terminal 74 and input terminal 38 may be represented as $-(g_{m16} R_8)/2$ where $g_{m16}$ is the transconductance of transistor $Q_{16}$ and $R_8$ is the resistance of resistor $R_8$. Further, the gain provided to the transistor $Q_{69}$ between terminal 76 and terminal 36 is $(g_{m69} R_9)/2$ where $g_{m69}$ is the transconductance of transistor $Q_{69}$ and $R_9$ is the resistance of resistor $R_9$. Since the total gain of the output stage may be represented as the algebraic sum of the gains provided to the signals fed between the base and collector electrodes of output transistor $Q_{OUT}$ such total gain may be represented as: $[g_{m15}R_7 + g_{m16}R_8 + g_{m16}R_9]/2$.

Since the transconductance of a transistor may be represented as $(I/V_T)$ where I is the emitter current of the transistor and $V_T = KT/q$ where K is Boltzman's constant, T is absolute temperature and q is the charge of an electron, it follows that the total small signal gain may be represented as: $[(I_1R_7/2V_T) + (I_1+I_2)R_8/2V_T + (I_2R_9)/2V_T]/2$; where $I_2$ is the current produced by current source 42. It is noted that the current source 42 increases the small signal gain by the terms $(I_2R_9)/4V_T + I_2R_8/4V_T$.

Considering now the operation of the circuit 10, the operation of the input stage 12, second stage 22 and level shifter 30 will first be discussed. If the voltage at input terminal 14 is more positive than the voltage at input terminal 16, transistor $Q_1$ conducts while transistor $Q_2$ is in a nonconducting mode. Thus, the voltage at terminal 20 becomes more positive than the voltage at terminal 18. In response to the voltages at input terminals 18, 20, transistor $Q_5$ is in a nonconducting mode and transistor $Q_6$ is placed in a conducting mode thereby producing a more positive voltage at terminal 26 than that produced at terminal 28. The DC levels of the voltage produced at terminals 26, 28 are shifted negatively by level shifter 30, as noted above, but the voltage at terminal 32 (and hence terminal 36) is still more positive than the voltage at terminal 34 (and hence terminal 38). It follows then that input terminal 36 will be more positive than terminal 38. On the other hand, if the voltage at input terminal 16 is more positive than the voltage at terminal 14, transistor $Q_2$ and $Q_5$ conduct, transistors $Q_1$, $Q_6$ are nonconducting and the voltage at terminal 34 (and hence terminal 38) is more positive than the voltage at terminal 32 (and hence terminal 36).

Considering now output stage 40, if the voltage at terminal 36 is more positive than the voltage at terminal 38, transistor $Q_{13}$ conducts nearly all of the current $I_1$ produced by current source 70 (here 3 mA). The current $I_1$ passes through the collector-emitter electrodes of transistor $Q_{15}$ causing a relatively large base-emitter voltage differential between transistor $Q_{15}$ and $Q_{16}$ with the result that transistor $Q_{69}$ conducts nearly all of the current $I_2$ (here 2 mA) produced by current source 42. The base of transistor $Q_{17}$ is pulled down a voltage approximately equal to $I_1R_7$ (where $R_7$ is the resistance of resistor $R_7$) thereby turning off the base charging source of output transistor $Q_{OUT}$. Charge presently in the base of output transistor $Q_{OUT}$ is rapidly discharged through the current source 42. That is, switch 44 electrically couples current source 42 to the base electrode of transistor $Q_{OUT}$ to provide an active base charge discharge circuit for such output transistor $Q_{OUT}$. After the base of output transistor $Q_{OUT}$ is discharged, the current $I_2$ of source 42 passes thereto from +Vcc through Schottky diode $S_{10}$ and transistor $Q_{67}$, resistor $R_9$ and the collector-emitter electrodes of transistor $Q_{17}$. Diode $S_{10}$ provides a limit of one Schottky voltage drop (about 0.5 volts) on the voltage swing at the base electrode of output transistor $Q_{OUT}$. The voltage at output 31 thus rises positively towards +Vcc because of the pull-up effect of transistor $Q_{18}$ and the base electrode of transistor $Q_{18}$ goes to 3.4 volts.

On the other hand, when the voltage at terminal 38 is more positive than the voltage at terminal 36, the current $I_1$ of source 70 flows through transistor $Q_{14}$ and $Q_{16}$. Under such condition, switch 44 electrically couples current source 42 to the emitter of transistor $Q_{16}$ and electrically decouples current source 42 from terminal 76. Thus, current $I_2$ also flows through the emitter-collector electrodes of transistor $Q_{16}$. Therefore, the total current through resistor $R_8$ is $I_1+I_2$. The base electrode of transistor $Q_{17}$ is pulled up towards the voltage at terminal 72. Transistor $Q_{17}$ charges the base of output transistor $Q_{OUT}$ through current limiting resistor $R_9$ (it being noted that the collector-emitter electrodes of transistor $Q_{69}$ are "open circuited".) Output transistor $Q_{OUT}$ is driven towards saturation and its collector voltage drops towards ground until such transistor $Q_{OUT}$ is clamped by the internal base-collector Schottky diode of transistor $Q_{OUT}$. It is noted that the current $(I_1+I_2)$ through transistor $Q_{16}$ and resistor $R_8$ increases the slew rate on the base of transistor $Q_{18}$ which drops the output voltage at output 31. Further, since $R_8$ passes a relatively large amount of current (i.e. current $I_1+I_2$) its resistance can be reduced in value to produce the proper voltage at the base electrode of transistor $Q_{18}$ and therefore, the time constant of the circuit (provided by such resistor and the inherent capacitance of the pull-up transistor $Q_{18}$) is reduced.

Having described a preferred embodiment of the invention, it will now be apparent to one of skill in the art that other embodiments incorporating its concept may be used. It is felt, therefore, that this invention should not be restricted to the disclosed embodiment but rather should be limited only by the spirit and scope of the appended claims.

What is claimed is:

1. An electronic circuit comprising:
    (a) a pair of transistors having connected first electrodes, and second electrodes coupled to control signals for controlling conducting conditions of the transistors;
    (b) a pair of diodes connected in opposing polarity between output electrodes of the pair of transistors;
    (c) means for coupling the output electrodes of the pair of transistors to a terminal adapted for coupling to a voltage source; and,
    (d) a circuit means, coupled between the terminal and the connected first electrodes of the pair of transistors, such circuit means having an impedance related to the impedance between the terminal and the output electrode of one of the pair of transistors, for providing a bias voltage at the connected first electrodes relative to voltages produced at the output electrodes of the pair of transistors to prevent saturation of the pair of transistors, such circuit means having a pair of parallel paths coupled between the terminal and the connected first electrodes, one of such paths having a diode and the other one of such paths having a resistor.

2. An electronic circuit comprising:
(a) a pair of transistors having connected first electrodes and a pair of diode clamped output electrodes;
(b) a pair of resistors connected between the output electrodes and a common terminal, such common terminal being adapted for coupling a voltage source;
(c) a circuit comprising a first resistor coupled between the common terminal and the connected first electrodes, and, in parallel with the first resistor, a second resistor and serially coupled diode.

3. The circuit recited in claim 2 including means for producing a voltage between the common terminal and the connected first electrodes related to the voltage between the common terminal and the output electrodes of one of the pair of transistors.

4. An electronic circuit comprising:
(a) a pair of transistors having connected base electrodes and a pair of emitter electrodes coupled to control signals, the transistors having conducting conditions controlled by the control signals;
(b) a pair of resistors connected between the collector electrodes of the pair of transistors and a voltage source;
(c) a pair of diodes connected in opposite polarity between the collector electrodes of the pair of transistors; and,
(d) a bias circuit, having a pair of paths connected in parallel between the voltage source and the base electrodes of the pair of transistors, for preventing such transistors from saturation, one of such paths having a diode and a serially connected resistor and the other one of such paths having a resistor.

5. The electronic circuit recited in claim 4 wherein the bias circuit comprises:
(a) a first resistor connected between the voltage source and the connected base electrodes;
(b) a second resistor; and,
(c) a diode serially connected with the second resistor; and,
wherein the first resistor is connected in parallel with the second resistor and serially connected diode.

6. The electronic circuit recited in claim 5 including means for producing a voltage across the bias circuit equal to the voltage produced between the voltage source and the collector electrode of one of the pair of transistors.

7. The electronic circuit recited in claim 6 including current source means coupled to the pair of transistors and the bias circuit means.

8. In combination:
(a) a differential amplifier comprising:
(i) a first pair of transistors having connected emitter electrodes;
(ii) a current source coupled to the emitter electrodes of the first pair of transistors;
(iii) a second pair of transistors having connected base electrodes and having emitter electrodes coupled to collector electrodes of the first pair of transistors;
(iv) a pair of resistors coupled between a voltage source and the collector electrodes of the second pair of transistors;
(v) a pair of diodes coupled in opposite polarity between the collector electrodes of the second pair of transistors;
(b) a bias circuit connected between the voltage source and the base electrodes of the second pair of transistors for preventing saturation of the second pair of transistors.

9. The electronic circuit recited in claim 8 wherein the bias circuit comprises:
(a) a first resistor coupled between the voltage source and the base electrodes of the second pair of transistors;
(b) a second resistor;
(c) a diode serially connected with the second resistor; and wherein
(d) the first resistor is coupled in parallel with the second resistor and serially connected diode.

10. The electronic circuit recited in claim 8 including means for producing a voltage across the bias circuit related to the voltage produced between the voltage source and the collector electrode of one of the second pair of transistors.

11. The electronic circuit recited in claim 10 including current source means coupled to the second pair of transistors and the bias circuit means.

12. The combination recited in claim 8 including a second differential amplifier comprising:
(a) a first pair of transistors having connected emitter electrodes;
(b) a current source coupled to the emitter electrodes of the first pair of transistors of the second differential amplifier;
(c) a second pair of transistors having connected base electrodes and having emitter electrodes coupled to the collectors of the first pair of transistors of the second differential amplifier;
(d) a pair of resistors coupled between a terminal and the collector electrodes of the second pair of transistors of the second differential amplifiers;
(e) a pair of diodes coupled in opposing polarity between the collectors of the second pair of transistors of the second differential amplifiers;
(f) wherein the collector electrodes of the second pair of transistors of the second differential amplifier are coupled to base electrodes of the first pair of transistors of the first mentioned differential amplifier; and
(g) wherein such bias circuit includes a diode and serially connected p-n junction electrically coupled between the voltage source and the terminal of the second differential amplifier.

13. The combination recited in claim 12 wherein the bias circuit comprises:
(a) a first resistor coupled between the voltage source and the connected base electrodes of the second pair of transistors of the first-mentioned differential amplifier;
(b) a second resistor;
(c) a diode serially connected with the second resistor; and wherein
(d) the first resistor is coupled in parallel with the second resistor and serially connected diode.

14. The combination recited in claim 13 including a diode and p-n junction serially coupled between the base electrodes of the first pair of transistors of the pair of differential amplifiers.

* * * * *